US009876036B2

(12) United States Patent
Han et al.

(10) Patent No.: US 9,876,036 B2
(45) Date of Patent: Jan. 23, 2018

(54) TFT ARRANGEMENT STRUCTURE

(71) Applicant: Shenzhen China Star Optoelectronics Technology Co., Ltd., Shenzhen (CN)

(72) Inventors: Baixiang Han, Shenzhen (CN); Longqiang Shi, Shenzhen (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 0 days.

(21) Appl. No.: 14/761,308

(22) PCT Filed: May 21, 2015

(86) PCT No.: PCT/CN2015/079425

§ 371 (c)(1),
(2) Date: Jul. 16, 2015

(87) PCT Pub. No.: WO2016/165183

PCT Pub. Date: Oct. 20, 2016

(65) Prior Publication Data

US 2016/0307935 A1 Oct. 20, 2016

(30) Foreign Application Priority Data

Apr. 14, 2015 (CN) .......................... 2015 1 0176251

(51) Int. Cl.
*H01L 27/12* (2006.01)
*H01L 29/45* (2006.01)
*H01L 27/32* (2006.01)

(52) U.S. Cl.
CPC ........ *H01L 27/1251* (2013.01); *H01L 27/124* (2013.01); *H01L 27/1218* (2013.01);
(Continued)

(58) Field of Classification Search
CPC ............. H01L 27/1251; H01L 27/1218; H01L 27/1222; H01L 27/1225; H01L 27/124
(Continued)

(56) References Cited

U.S. PATENT DOCUMENTS 6,023,308 A * 2/2000 Takemura ........... G02F 1/13624 349/149
9,356,054 B2 * 5/2016 Miyairi ............... H01L 27/1225
(Continued)

FOREIGN PATENT DOCUMENTS

CN 103367353 A 10/2013

*Primary Examiner* — Ori Nadav
(74) *Attorney, Agent, or Firm* — Leong C. Lei

(57) ABSTRACT

The present invention provides a TFT arrangement structure, comprising a first thin film transistor (T1) and a second thin film transistor (T2) controlled by the same control signal line; the first active layer (SC1) of the first thin film transistor (T1) and the second active layer (SC2) of the second thin film transistor (T2) are at different layers, and positioned to stack up in space, and the first source (S1) and the first drain (D1) of the first thin film transistor (T1) are formed on the first active layer (SC1), and the second source (S2) and the second drain (D2) of the second thin film transistor (T2) are formed on the second active layer (SC2); the gate layer (Gate) is electrically coupled to the control signal line to control on and off of the first, the second thin film transistors (T1, T2). The TFT arrangement structure can reduce the space of the circuit arrangement to increase the aperture ratio of the display panel and satisfy the demands of the narrow frame and high resolution to the display panel.

13 Claims, 4 Drawing Sheets

(52) U.S. Cl.
CPC .......... *H01L 27/1222* (2013.01); *H01L 29/45* (2013.01); *H01L 27/1225* (2013.01); *H01L 27/3262* (2013.01)

(58) Field of Classification Search
USPC .................................................... 257/43, 347
See application file for complete search history.

(56) References Cited

U.S. PATENT DOCUMENTS

2010/0237352 A1* 9/2010 Sele ........................ H01L 27/12 257/66
2011/0012104 A1* 1/2011 Kang ...................... H01L 27/12 257/43
2013/0214279 A1* 8/2013 Nishimura .......... G02F 1/13338 257/59

* cited by examiner

TFT ARRANGEMENT STRUCTURE

FIELD OF THE INVENTION

The present invention relates to a display technology field, and more particularly to a TFT arrangement structure.

BACKGROUND OF THE INVENTION

A flat panel display possesses advantages of being ultra thin, power saved and radiation free and has been widely utilized. The present flat panel display devices at present mainly comprise the Liquid Crystal Display (LCD) and the Organic Light Emitting Display (OLED).

Thin Film transistors (TFT) are important components of a flat panel display device. The TFTs can be formed on a glass substrate and a plastic substrate and generally employed as switch elements and driving elements utilized such as flat panel displays, LCDs, OLEDs and et cetera. As regarding of LCD, the Active Matrix Liquid Crystal Display utilizes GOA (Gate Drive On Array) circuit constructed with a plurality of TFTs is required to integrate the gate driver (Gate Drive IC) on the thin film transistor array substrate to achieve the scan line by line for driving the liquid crystal panel. For the Active Matrix OLED (AMOLED), the pixel compensation circuit constructed with a plurality of TFTs is required to implement compensation to the threshold voltage of the drive thin film transistor to make the display brightness of the AMOLED even.

With the global competition of the display panel grows more bitter, the demands of all the display makers for the narrow frame, high resolution get higher and higher. Particularly, in the mobile display device field, the present display panel frame has been narrowed to be under 2 mm, and the Pixels Per Inch (PPI) has already reached up higher than 500. For the design of the display panel, the narrower frame means smaller GOA arrangement space. The higher PPI means a smaller sub pixel area. Under this circumstance that the process ability is unchanged, the circuit effective arrangement area gets smaller. Particularly for the AMOLED display panel, one sub pixel generally comprises 2-7 TFTs. Thus, the higher demand is proposed for the circuit arrangement.

The present GOA circuit and AMOLED pixel compensation circuit generally relate to the condition that one control signal line controls two TFTs. As shown in FIG. 1, both the gates of the first, second thin film transistors T10, T20 are electrically coupled to one control signal line G, i.e. both the first, second thin film transistors T10, T20 are controlled by the control signal line G; FIG. 2 is a TFT arrangement structure diagram of the circuit shown in FIG. 1. Both the source S10, the drain D10 of the first thin film transistor T10 are formed on the patterned active layer SC. Similarly, both the source S20, the drain D20 of the second thin film transistor T20 are formed on the patterned active layer SC. The same gate layer Gate coupled to the one control signal line controls the first, second thin film transistors T10, T20 at the same time. Because all the source S10, the drain D10 of the first thin film transistor T10 and the source S20, the drain D20 of the second thin film transistor T20 are formed on the patterned active layer SC. The first, second thin film transistors T10, T20 can only arranged in parallel and in interval along the pattern alignment direction of the active layer SC. The occupied arrangement space is larger, which goes against the development of the narrow frame and high resolution of the display panel.

SUMMARY OF THE INVENTION

An objective of the present invention is to provide a TFT arrangement structure, applicable to a GOA circuit and an AMOLED pixel compensation circuit and capable of reducing the space of the circuit arrangement in condition of ensuring the circuit function to increase the aperture ratio of the display panel and satisfying the demands of the narrow frame and high resolution to the display panel.

For realizing the aforesaid objective, the present invention provides a TFT arrangement structure, comprising a first thin film transistor and a second thin film transistor controlled by the same control signal line;

the first thin film transistor comprises a gate layer, a first active layer, a first source and a first drain, and the second thin film transistor comprises the gate layer, a second active layer, a second source and a second drain;

the first active layer and the second active layer are at different layers, and positioned to stack up in space, and the first source and the first drain are formed on the first active layer, and the second source and the second drain are formed on the second active layer;

the gate layer is electrically coupled to the control signal line to control on and off of the first, the second thin film transistors.

The first active layer and the second active layer that are located on different layers that are spaced from each other in a given direction extend over each other in space such that the first active layer and the second active layer intersect each other as viewed in the given direction.

The TFT arrangement structure further comprises a substrate, a first insulation layer and a second insulation layer;

the first active layer is positioned on the substrate, and the first source and the first drain respectively cover two ends of the first active layer, and the first insulation layer is positioned on the first active layer, the first source, the first drain and the substrate, and the gate layer is positioned on the first insulation layer, and the second insulation layer is positioned on the gate layer and the first insulation layer, and the second active layer is positioned on the second insulation layer, and the second source and the second drain respectively cover two ends of the second active layer.

The substrate is a glass substrate or a plastic substrate.

Material of the first source, the first drain, the second source, the second drain and the gate layer is a stack combination of one or more of molybdenum, titanium, aluminum and copper.

Material of the first active layer and the second active layer is one of amorphous silicon based semiconductor, polysilicon based semiconductor and Zinc Oxide based semiconductor.

Material of the first insulation layer and the second insulation layer is Silicon Nitride, Silicon Oxide or a combination of the two.

The first active layer and the second active layer are both n-type semiconductor or both p-type semiconductor.

One of the first active layer and the second active layer is p-type semiconductor and the other is n-type semiconductor.

The TFT arrangement structure is applicable to a GOA circuit and an AMOLED pixel compensation circuit.

The present invention further provides a TFT arrangement structure, comprising a first thin film transistor and a second thin film transistor controlled by the same control signal line;

the first thin film transistor comprises a gate layer, a first active layer, a first source and a first drain, and the second thin film transistor comprises the gate layer, a second active layer, a second source and a second drain;

the first active layer and the second active layer are at different layers, and positioned to stack up in space, and the first source and the first drain are formed on the first active layer, and the second source and the second drain are formed on the second active layer;

the gate layer is electrically coupled to the control signal line to control on and off of the first, the second thin film transistors;

wherein the first active layer and the second active layer that are located on different layers that are spaced from each other in a given direction extend over each other in space such that the first active layer and the second active layer intersect each other as viewed in the given direction;

and the TFT arrangement structure further comprises a substrate, a first insulation layer and a second insulation layer;

the first active layer is positioned on the substrate, and the first source and the first drain respectively cover two ends of the first active layer, and the first insulation layer is positioned on the first active layer, the first source, the first drain and the substrate, and the gate layer is positioned on the first insulation layer, and the second insulation layer is positioned on the gate layer and the first insulation layer, and the second active layer is positioned on the second insulation layer, and the second source and the second drain respectively cover two ends of the second active layer;

wherein the substrate is a glass substrate or a plastic substrate;

wherein material of the first source, the first drain, the second source, the second drain and the gate layer is a stack combination of one or more of molybdenum, titanium, aluminum and copper;

wherein material of the first active layer and the second active layer is one of amorphous silicon based semiconductor, polysilicon based semiconductor and Zinc Oxide based semiconductor;

wherein material of the first insulation layer and the second insulation layer is Silicon Nitride, Silicon Oxide or a combination of the two.

The benefits of the present invention are: the TFT arrangement structure provided by the present invention adds the second active layer and positions the first active layer and the second active layer at different layers to make the two stack up in space. By stacking up the two TFTs controlled by the same control signal line in space, it is capable of reducing the space of the circuit arrangement in condition of ensuring the circuit function to increase the aperture ratio of the display panel and satisfying the demands of the narrow frame and high resolution to the display panel.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
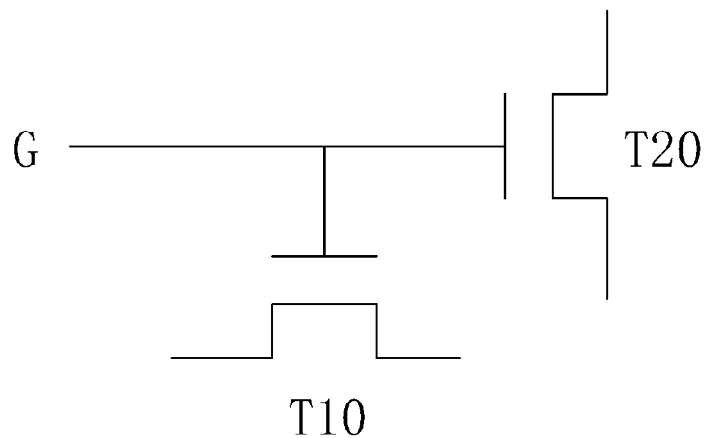
FIG. 1 is a circuit diagram of a TFT arrangement according to prior art.
Figure 2:
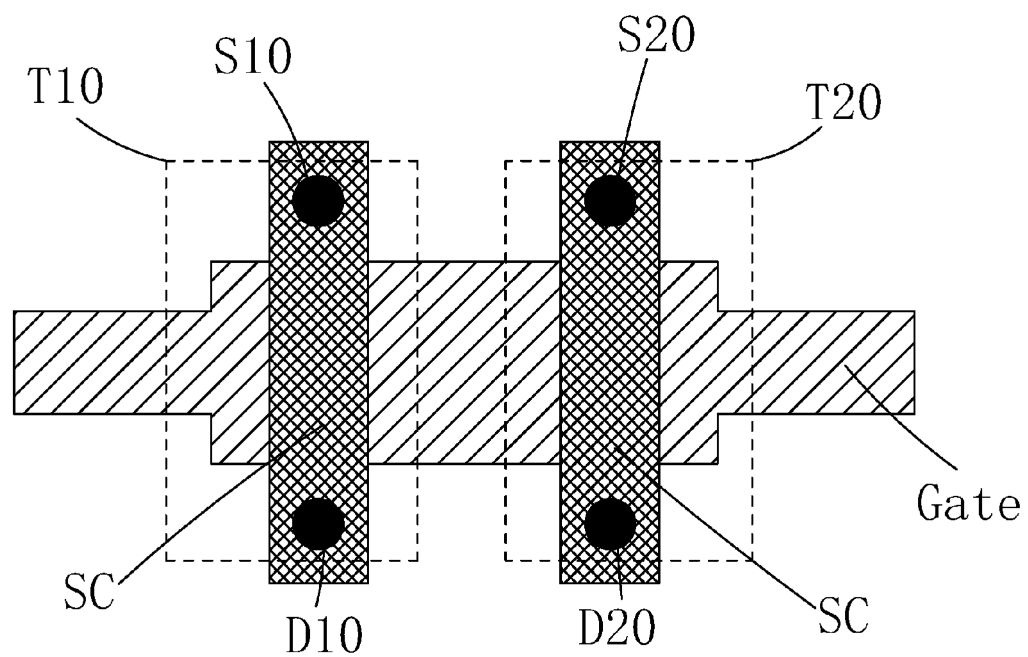
FIG. 2 is a TFT arrangement structure diagram of the circuit shown in FIG. 1.
Figure 3:
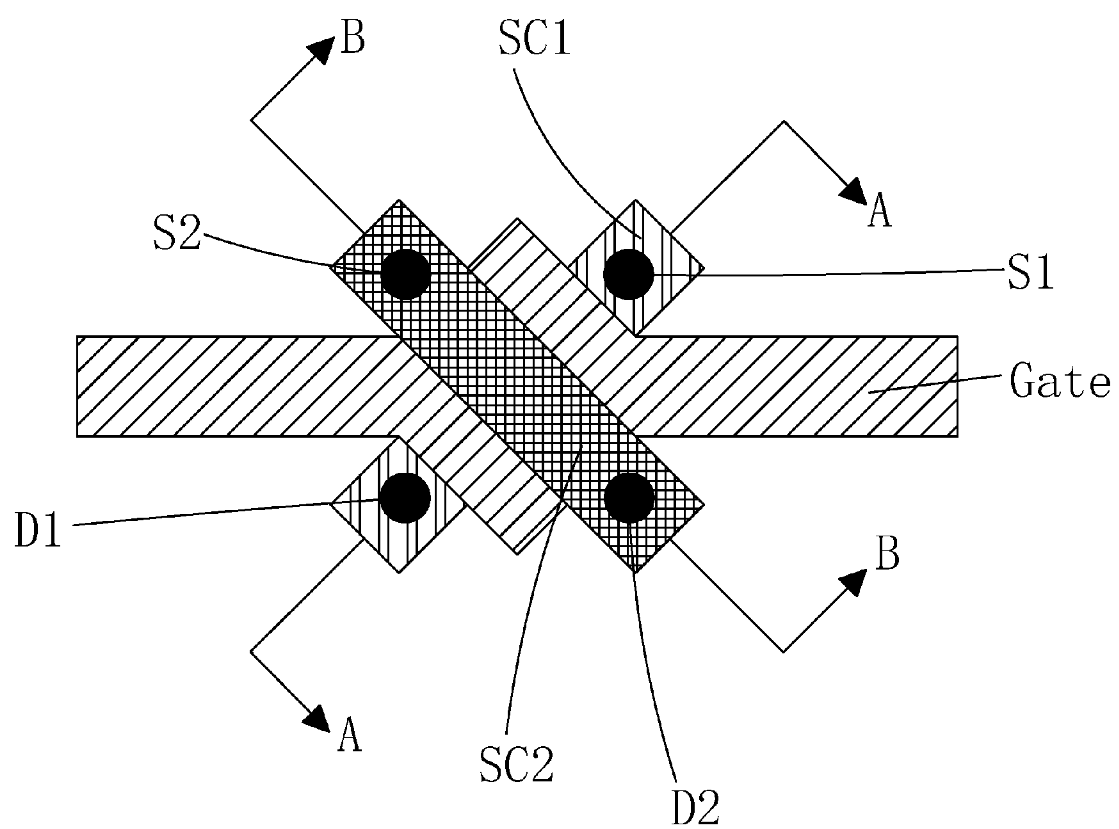
FIG. 3 is a top view diagram of the TFT arrangement structure according to the present invention.
Figure 4:
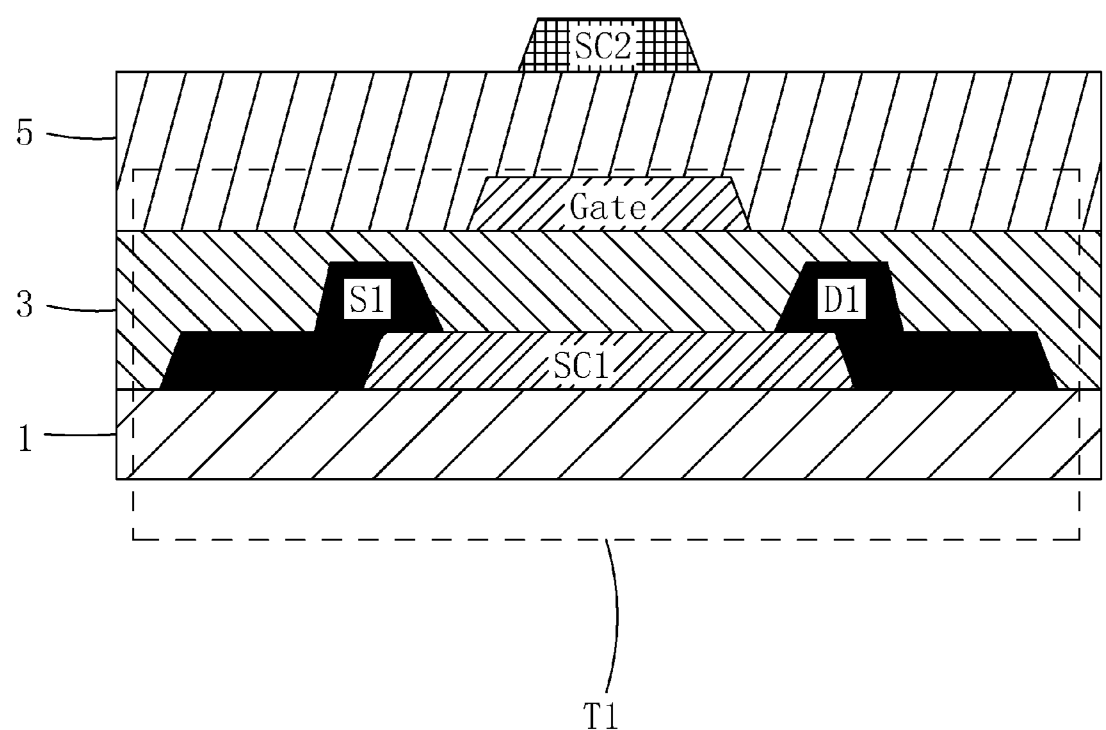
FIG. 4 is a sectional diagram corresponding to A-A section in FIG. 3.
Figure 5:
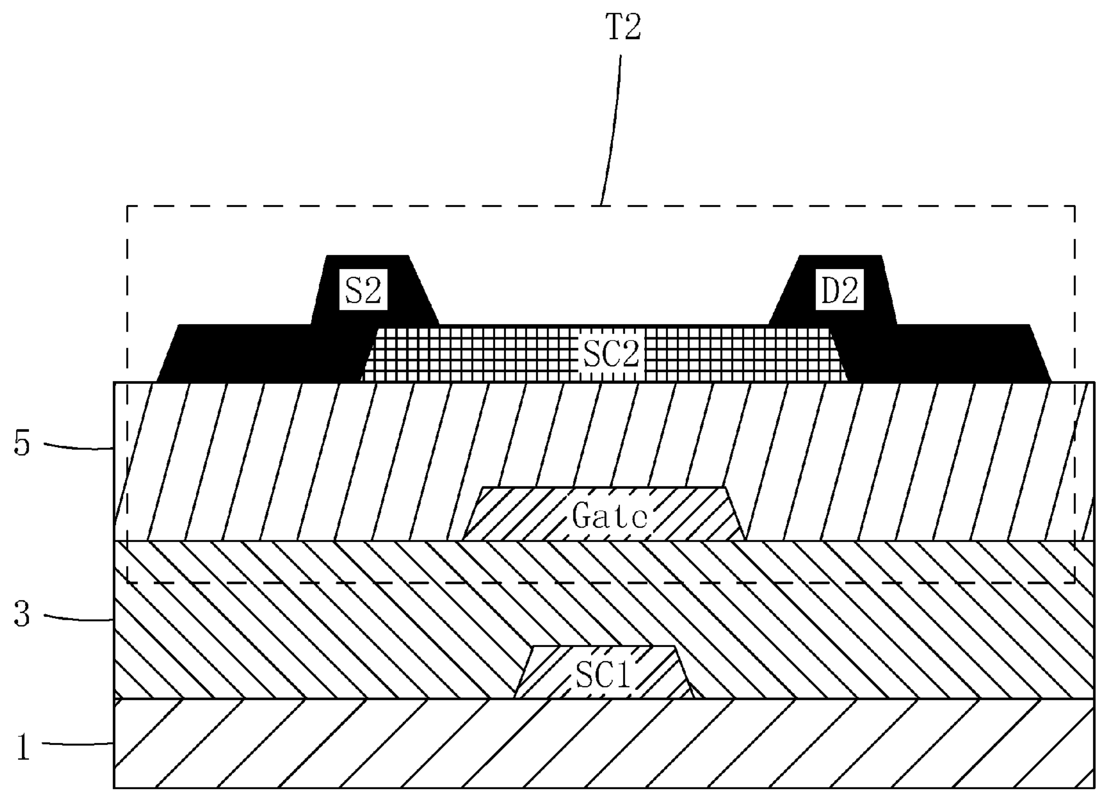
FIG. 5 is a sectional diagram corresponding to B-B section in FIG. 3.

Please refer to FIG. 3, FIG. 4 and FIG. 5. The present invention provides a TFT arrangement structure, comprising a first thin film transistor T1 and a second thin film transistor T2 controlled by the same control signal line.

The first thin film transistor T1 comprises a gate layer Gate, a first active layer SC1, a first source S1 and a first drain D1, and the second thin film transistor T2 comprises the gate layer Gate, a second active layer SC2, a second source S2 and a second drain D2.

The first active layer SC1 and the second active layer SC2 are at different layers, and positioned to stack up in space, and the first source S1 and the first drain D1 are formed on the first active layer SC1, and the second source S2 and the second drain D2 are formed on the second active layer SC2. Thus, the two TFTs, the first thin film transistor T1 and the second thin film transistor T2 are positioned to stack up in space.

The gate layer Gate is electrically coupled to the control signal line to control on and off of the first, the second thin film transistors T1, T2.

Figure 6:
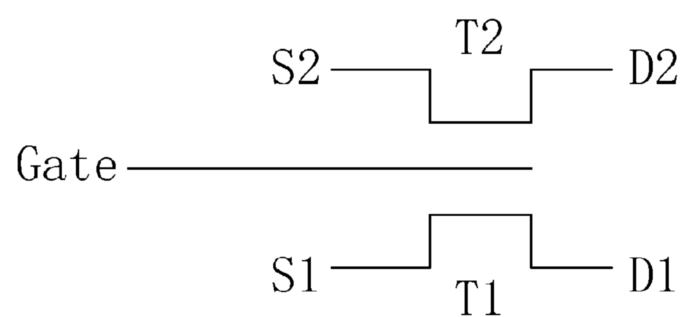
FIG. 6 is a circuit diagram corresponding to the TFT arrangement structure shown in FIG. 3.

As shown in FIG. 6, the TFT arrangement structure of the present invention realizes the stacking up in space of the first thin film transistor T1 and the second thin film transistor T2. Compared with prior arts, of which the two TFTs controlled by the same control signal line are arranged in parallel and in interval along the pattern alignment direction of the active layer SC, it is capable of tremendously reducing the space of the circuit arrangement to increase the aperture ratio of the display panel and satisfy the demands of the narrow frame and high resolution to the display panel.

Furthermore, as shown in FIG. 3, the first active layer SC1 and the second active layer SC2 are located on different layers that are spaced from each other in a given direction and extend over each other in space such that the first active layer SC1 and the second active layer SC2 intersect each other as viewed in the given direction for reducing the space of the circuit arrangement in advance and easily distinguishing a led out point of the first source S1 and the first drain D1 on the first active layer SC1 and a led out point of the second source S2 and the second drain D2 on the second active layer SC2.

Specifically, as shown in FIG. 4, FIG. 5, the TFT arrangement structure further comprises a substrate 1, a first insulation layer 3 and a second insulation layer 5. The first active layer SC1 is positioned on the substrate 1, and the first source S1 and the first drain D1 respectively cover two ends of the first active layer SC1 to respectively make the first source S1 and the first drain D1 electrically contact the first active layer SC1; the first insulation layer is positioned on the first active layer SC1, the first source S1, the first drain D1 and the substrate 1; the gate layer Gate is positioned on the first insulation layer 3; the second insulation layer 5 is positioned on the gate layer Gate and the first insulation layer 3; the second active layer SC2 is positioned on the second insulation layer 5, and the second source S2 and the second drain D2 respectively cover two ends of the second active layer SC2 to respectively make the second source S2 and the second drain D2 electrically contact the second active layer SC2.

Selectably, the substrate 1 is a glass substrate or a plastic substrate.

Material of the first source S1, the first drain D1, the second source S2, the second drain D2 and the gate layer Gate is a stack combination of one or more of molybdenum, titanium, aluminum and copper.

Material of the first active layer SC1 and the second active layer SC2 is one of amorphous silicon based semiconductor, polysilicon based semiconductor and Zinc Oxide based semiconductor.

The first active layer SC1 and the second active layer SC2 are both n-type semiconductor or both p-type semiconductor. Under such circumstance, the gate layer Gate is controlled by the control signal line to make the first thin film transistor T1 and the second thin film transistor T2 to be on or off at the same time.

Alternatively, one of the first active layer SC1 and the second active layer SC2 is p-type semiconductor and the other is n-type semiconductor. Under such circumstance, the first thin film transistor T1 and the second thin film transistor T2 have contrary threshold voltages. The gate layer Gate is controlled by the control signal line. As the first thin film transistor T1 is on, the second thin film transistor T2 is off and as the first thin film transistor T1 is off, the second thin film transistor T2 is on.

Material of the first insulation layer 3 and the second insulation layer 5 is Silicon Nitride, Silicon Oxide or a combination of the two.

The aforesaid TFT arrangement structure is applicable to a GOA circuit and an AMOLED pixel compensation circuit and capable of reducing the space of the circuit arrangement in condition of ensuring the circuit function to increase the aperture ratio of the display panel and satisfying the demands of the narrow frame and high resolution to the display panel.

In conclusion, the TFT arrangement structure adds the second active layer and positions the first active layer and the second active layer at different layers to make the two stack up in space. By stacking up the two TFTs controlled by the same control signal line in space, it is capable of reducing the space of the circuit arrangement in condition of ensuring the circuit function to increase the aperture ratio of the display panel and satisfying the demands of the narrow frame and high resolution to the display panel.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A TFT arrangement structure, comprising a first thin film transistor and a second thin film transistor controlled by the same control signal line;

wherein the first thin film transistor comprises a gate layer, a first active layer, a first source and a first drain, and the second thin film transistor comprises the gate layer, a second active layer, a second source and a second drain;

the first active layer and the second active layer are at different layers that are respectively on horizontal planes that are spaced from each other in a vertical direction, and positioned to stack up in space in the vertical direction, wherein the first active layer and the second active layer are respectively of elongated shapes on the horizontal planes and respectively have a first lengthwise dimension and a second lengthwise dimension respectively defined in a first horizontal direction and a second horizontal direction, and the first source and the first drain are formed on the first active layer respectively at opposite end portions of the first active layer in the first horizontal direction and spaced from each other such that a first line extending through the first source and first drain is set in the first horizontal direction, and the second source and the second drain are formed on the second active layer respectively at opposite end portions of the second active layer in the second horizontal direction and spaced from each other such that a second line extending through the second source and second drain is set in second second horizontal direction;

the gate layer is electrically coupled to the control signal line to control on and off the first and the second thin film transistors; and the first active layer and the second active layer that are located on different layers in the vertical direction extend over each other in space with a vertical line extending through the first active layer and the second actively layer to define a center point such that the first horizontal direction and the second horizontal direction are different from each other and are not parallel to each other and are angularly shifted away from each other about the center point and the first source and the first drain are angularly shifted away from the second source and the second drain respectively and are not coincident with each other in the vertical direction;

wherein the gate layer comprises a gate line that is located between and spaced from the first and second active layers in the vertical direction and has a portion coincident with the center point, the gate line extending through the center point in a third direction that is angularly shifted away from the first horizontal direction of the first active layer and the second horizontal direction of the second active layer and is angularly spaced from the first horizontal direction of the first active layer and the second horizontal direction of the second active layer by first and second angles that are substantially identical.

2. The TFT arrangement structure according to claim 1, further comprising a substrate, a first insulation layer and a second insulation layer;

the first active layer is positioned on the substrate, and the first source and the first drain respectively cover two ends of the first active layer, and the first insulation layer is positioned on the first active layer, the first source, the first drain and the substrate, and the gate layer is positioned on the first insulation layer, and the second insulation layer is positioned on the gate layer and the first insulation layer, and the second active layer is positioned on the second insulation layer, and the second source and the second drain respectively cover two ends of the second active layer.

3. The TFT arrangement structure according to claim 2, wherein the substrate is a glass substrate or a plastic substrate.

4. The TFT arrangement structure according to claim 2, wherein material of the first source, the first drain, the second source, the second drain and the gate layer is a stack combination of one or more of molybdenum, titanium, aluminum and copper.

5. The TFT arrangement structure according to claim 2, wherein material of the first active layer and the second active layer is one of amorphous silicon based semiconductor, polysilicon based semiconductor and Zinc Oxide based semiconductor.

6. The TFT arrangement structure according to claim 2, wherein material of the first insulation layer and the second insulation layer is Silicon Nitride, Silicon Oxide or a combination of the two.

7. The TFT arrangement structure according to claim 5, wherein the first active layer and the second active layer are both n-type semiconductor or both p-type semiconductor.

8. The TFT arrangement structure according to claim 5, wherein one of the first active layer and the second active layer is p-type semiconductor and the other is n-type semiconductor.

9. The TFT arrangement structure according to claim 1, wherein the TFT arrangement structure is applicable to a GOA circuit and an AMOLED pixel compensation circuit.

10. A TFT arrangement structure, comprising a first thin film transistor and a second thin film transistor controlled by the same control signal line;

wherein the first thin film transistor comprises a gate layer, a first active layer, a first source and a first drain, and the second thin film transistor comprises the gate layer, a second active layer, a second source and a second drain;

the first active layer and the second active layer are at different layers that are respectively on horizontal planes that are spaced from each other in a vertical direction, and positioned to stack up in space in the vertical direction, wherein the first active layer and the second active layer are respectively of elongated shapes on the horizontal planes and respectively have a first lengthwise dimension and a second lengthwise dimension respectively defined in a first horizontal direction and a second horizontal direction, and the first source and the first drain are formed on the first active layer respectively at opposite end portions of the first active layer in the first horizontal direction and spaced from each other such that a first line extending through the first source and first drain is set in the first horizontal direction, and the second source and the second drain are formed on the second active layer respectively at opposite end portions of the second active layer in the second horizontal direction and spaced from each other such that a second line extending through the second source and second drain is set in the second horizontal direction;

the gate layer is electrically coupled to the control signal line to control on and off the first, the second thin film transistors;

wherein the first active layer and the second active layer that are located on different layers in the vertical direction extend over each other in space with a vertical line extending through the first active layer and the second actively layer to define a center point such that the first horizontal direction and the second horizontal direction are different from each other and are not parallel to each other and are angularly shifted away from each other about the center point and the first source and the first drain are angularly shifted away from the second source and the second drain respectively and are not coincident with each other in the vertical direction;

wherein the gate layer comprises a gate line that is located between and spaced from the first and second active layers in the vertical direction and has a portion coincident with the center point, the gate line extending through the center point in a third direction that is angularly shifted away from the first horizontal direction of the first active layer and the second horizontal direction of the second active layer and is angularly spaced from the first horizontal direction of the first active layer and the second horizontal direction of the second active layer by first and second angles that are substantially identical;

the TFT arrangement structure further comprises a substrate, a first insulation layer and a second insulation layer; and the first active layer is positioned on the substrate, and the first source and the first drain respectively cover two ends of the first active layer, and the first insulation layer is positioned on the first active layer, the first source, the first drain and the substrate, and the gate layer is positioned on the first insulation layer, and the second insulation layer is positioned on the gate layer and the first insulation layer, and the second active layer is positioned on the second insulation layer, and the second source and the second drain respectively cover two ends of the second active layer;

wherein the substrate is a glass substrate or a plastic substrate;

wherein material of the first source, the first drain, the second source, the second drain and the gate layer is a stack combination of one or more of molybdenum, titanium, aluminum and copper;

wherein material of the first active layer and the second active layer is one of amorphous silicon based semiconductor, polysilicon based semiconductor and Zinc Oxide based semiconductor; and wherein material of the first insulation layer and the second insulation layer is Silicon Nitride, Silicon Oxide or a combination of the two.

11. The TFT arrangement structure according to claim 10, wherein the first active layer and the second active layer are both n-type semiconductor or both p-type semiconductor.

12. The TFT arrangement structure according to claim 10, wherein one of the first active layer and the second active layer is p-type semiconductor and the other is n-type semiconductor.

13. The TFT arrangement structure according to claim 10, wherein the TFT arrangement structure is applicable to a GOA circuit and an AMOLED pixel compensation circuit.

* * * * *